(12) United States Patent
Suito

(10) Patent No.: US 9,564,236 B2
(45) Date of Patent: Feb. 7, 2017

(54) NAND FLASH MEMORY AND READING METHOD THEREOF

(71) Applicant: Winbond Electronics Corp., Taichung (TW)

(72) Inventor: Katsutoshi Suito, Tokyo (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 14/876,828

(22) Filed: Oct. 7, 2015

(65) Prior Publication Data

US 2016/0163395 A1    Jun. 9, 2016

(30) Foreign Application Priority Data

Dec. 8, 2014    (JP) .................................. 2014-247934

(51) Int. Cl.
*G11C 16/26*    (2006.01)
*G11C 16/04*    (2006.01)
(Continued)

(52) U.S. Cl.
CPC ........... *G11C 16/26* (2013.01); *G11C 16/0483* (2013.01); *G11C 16/3445* (2013.01);
(Continued)

(58) Field of Classification Search
CPC .............................. G11C 16/26; G11C 11/5635
(Continued)

(56) References Cited

U.S. PATENT DOCUMENTS 5,917,757 A  *  6/1999  Lee ........................... G05F 3/20
                                                                257/E27.103
8,289,776 B2    10/2012  Sarin et al.
(Continued)

FOREIGN PATENT DOCUMENTS

JP    H03-283200    12/1991
JP    11-176177      7/1999
(Continued)

OTHER PUBLICATIONS

Helm et al., "A 128Gb MLC NAND-Flash device using 16nm planar cell", Solid-State Circuits Conference Digest of Technical Papers (ISSCC), 2014 IEEE International, Feb. 12, 2014, pp. 326-327.
(Continued)

*Primary Examiner* — Hoai V Ho
*Assistant Examiner* — Muna A Techane
(74) *Attorney, Agent, or Firm* — Jianq Chyun IP Office

(57) ABSTRACT

The disclosure provides a NAND flash memory and a reading method thereof, which may read a negative threshold value of a memory cell without using a negative-voltage-generating circuit. The disclosed NAND flash memory includes a sense amplifier, a bit line selecting circuit and an array having a plurality of NAND string units. The disclosed NAND flash memory includes a ΔV supplying portion element that applies a positive voltage to a source line, a P well formed with a selected memory cell, and a non-selected bit line which is adjacent to a selected bit line, within a predetermined time period, after the selected bit line is pre-charged and during a reading process.

9 Claims, 9 Drawing Sheets

(51) Int. Cl.
  *G11C 16/34* (2006.01)
  *G11C 16/24* (2006.01)
  *G11C 16/14* (2006.01)
  *G11C 11/56* (2006.01)
(52) U.S. Cl.
  CPC ....... *G11C 11/5635* (2013.01); *G11C 11/5642* (2013.01); *G11C 16/14* (2013.01); *G11C 16/24* (2013.01)
(58) Field of Classification Search
  USPC .................................................... 365/185.12
  See application file for complete search history.

(56) References Cited

U.S. PATENT DOCUMENTS

| | | | |
|---|---|---|---|
| 2006/0133150 | A1 | 6/2006 | Shibata |
| 2009/0067236 | A1* | 3/2009 | Isobe .................. G11C 11/5642 365/185.03 |
| 2013/0250694 | A1* | 9/2013 | Kutsukake ............. G11C 16/10 365/185.18 |
| 2014/0104947 | A1* | 4/2014 | Yamauchi .......... G11C 16/0483 365/185.09 |

FOREIGN PATENT DOCUMENTS

| | | |
|---|---|---|
| JP | H11-176960 | 7/1999 |
| JP | 2006172630 | 6/2006 |
| JP | 2008047219 | 2/2008 |
| JP | 2008103003 | 5/2008 |
| JP | 2009064516 | 3/2009 |
| JP | 2009158079 | 7/2009 |
| JP | 2014049149 | 3/2014 |
| JP | 2015015069 | 1/2015 |
| KR | 20060069290 A | 6/2006 |
| KR | 20090026092 A | 3/2009 |

OTHER PUBLICATIONS

"English translation of Office Action of Japan Counterpart Application", issued on Oct. 27, 2015, p. 1-p. 5.
"Office Action of Korea Counterpart Application", issued on Aug. 17, 2016, with English translation thereof, p. 1-p. 9.

* cited by examiner

|  | Erasing | Writing | Reading |
|---|---|---|---|
| Selected WL | 0 | 15~20V | 0 |
| Non-selected WL | F | 10V | 4.5 |
| SGD | F | Vcc | 4.5 |
| SGS | F | 0 | 4.5 |
| SL | F | Vcc | $0/+\Delta V$ |
| P-well | 21 | 0 | $0/+\Delta V$ |

FIG.6

NAND FLASH MEMORY AND READING METHOD THEREOF

CROSS-REFERENCE TO RELATED APPLICATION

This application claims the priority benefit of Japan application serial no. 2014-247934, filed on Dec. 8, 2014. The entirety of the above-mentioned patent application is hereby incorporated by reference herein and made a part of this specification.

BACKGROUND OF THE DISCLOSURE

1. Field of the Disclosure

The disclosure generally relates to a non-volatile semiconductor memory device and a reading method thereof, and more particularly, to a NAND flash memory and a reading method of a negative threshold voltage of a memory cell of the NAND flash memory.

2. Description of Related Art

A page reading method of a NAND flash memory is performed by alternatively reading pages including even-numbered bit lines or alternatively reading pages including odd-numbered bit lines. When the even-numbered pages are selected, the even-numbered pages are to be connected to a sense amplifier so as to perform the reading of the even-numbered pages; during this period, the non-selected odd-numbered pages will be separated from the sense amplifier, and a shielding potential such as ground level will be supplied to the odd-numbered bit lines so as to lower noises caused by capacitive couplings between adjacent bit lines. A patent document 1 (Japanese Unexamined Patent Publication No. 11-176177) shows a conventional non-volatile semiconductor storage.

SUMMARY OF THE DISCLOSURE

Problem to be Solved by the Disclosure

In a NAND flash memory, a memory cell can memorize 1 bit of data or multi-bit data. FIG. 1 shows typical threshold value distributions of a memory cell which memorizes 1 bit of data. As shown in FIG. 1, a threshold value distribution of a memory cell smaller than 0V is interpreted as a data "1", in which electrical charges are being erased in this state; a threshold value distribution of a memory cell greater than 0V is interpreted as a data "0", which is programmed with electrical charges in this state. Therefore, during a reading process, for instance, in the period of applying 0V to a selected word line, if the memory cells are turned on, then the data "1" is detected, and if the memory cells are not turned on, then the data "0" is detected.

A threshold value distribution margin of the data "1" or the data "0", as shown in FIG. 1, is preferably narrow. Hence, ideally, a maximum voltage difference D between a lower limit value Min of a negative threshold value distribution margin of the data "1" and an upper limit value Max of a positive threshold value distribution margin of the data "0" should be small. If the maximum voltage difference D is too large, then following problems would be present. When a memory cell having the lower limit value Min of a threshold value is adjacent to a memory cell having the upper limit value Max of a threshold value, electrical charges of the floating gate of one of the memory cells may cause a capacitive interference to the floating gate of the other memory cell, and thus is hard to perform an accurate reading. Therefore, it is desirable to reduce the maximum voltage difference D, and a method for reducing the maximum voltage difference D which can be considered is disclosed in the following. That is, the lower limit value Min of the negative threshold value distribution is controlled to be not lower than a certain value. For instance, during the erasing verification, the reading of the negative threshold value of the memory cell must be performed; therefore, it is required to perform the said control to have a negative voltage with a desired size.

In order to apply a negative voltage to the selected word line, a negative-voltage-generating circuit is usually required. FIG. 2A shows an example of a transistor that is used in the negative-voltage-generating circuit. A negative-voltage generating portion 10 generates a negative voltage, and a N-type metal oxide semiconductor (NMOS) transistor 12 applies the negative voltage to the selected word line. The negative voltage may be, for example, −1 V. Now, if the NMOS transistor is formed within a P-type semiconductor substrate 14 which is applied a voltage of 0 V, a forward bias would be formed between the P-type substrate 14 and the source/drain, which cause the NMOS transistor 12 of such structure to be unable to be used. Hence, as shown in FIG. 2B, it is required to form a N-well 16 within the P-type substrate 14, form a P-well 18 within the N-well 16, and form the NMOS transistor 12 within the P-well 18, so that a reverse bias is existed between the P-well 18 and the N-well 16. The approach of forming such triple-well structure within the substrate can enlarge a distribution area of the negative-voltage-generating circuit, thereby hindering the miniaturization and the high integration of a wafer.

The purpose of the disclosure is to solve such conventional problem, and to provide a flash memory capable of reading a negative threshold value of a memory cell without using a negative-voltage-generating circuit.

Accordingly, the purpose of the disclosure is to provide a flash memory capable of controlling a lower limit value of a negative threshold value distribution margin.

Technical Means to Solve the Problem

A reading method of a NAND flash memory of the disclosure includes the following steps. A voltage is pre-charged to a selected bit line. A voltage for determining a threshold value of a memory cell is applied to a selected word line. A voltage capable of turning on the memory cell regardless of a status of the memory cell is applied to a non-selected word line. A voltage of the selected bit line is detected after the selected bit line is discharged by electrically coupling the pre-charged selected bit line to a source line. After the selected bit line is pre-charged, a positive voltage is applied to the source line, a P-well formed with a selected memory cell and a non-selected bit line adjacent to the selected bit line within a predetermined time period.

Preferably, the reading method of the disclosure further includes a step of discharging the selected bit line started after applying the positive voltage. In addition, the step of applying the positive voltage is stopped before detecting the voltage of the selected bit line. Preferably, the positive voltage is set according to a negative threshold value of the memory cell that is to be read. Preferably, the step of applying the positive voltage is performed to short out the source line, the P-well and the non-selected bit line, and to simultaneously apply the positive voltage to the source line, the P-well and the non-selected bit line. Preferably, the step of applying the positive voltage is performed to turn on a plurality of transistors respectively connected with the source line, the P-well and the non-selected bit line, such that the source line, the P-well and the non-selected bit line are connected in parallel, and to apply the positive voltage to the transistors. Preferably, when the selected bit line is an odd-numbered bit line, the non-selected bit line is an even-numbered bit line, and when the selected bit line is the even-numbered bit line, the non-selected bit line is the odd-numbered bit line. Preferably, the reading method of the NAND flash memory is executed for verifying a lower limit value of a negative threshold value distribution at erasing. Preferably, the reading method of the NAND flash memory is executed after verifying an upper limit value of the negative threshold value distribution at erasing.

The NAND flash memory of the disclosure has a memory array formed with a plurality of NAND strings. The plurality of NAND strings includes a plurality of memory cells connected together in series. The flash memory includes at least one source line, a plurality of word lines, a plurality of bit lines, and a page buffer/sense circuit and a $\Delta V$ supplying portion. The source line is connected to an end portion of each of the plurality of NAND strings. The plurality of word lines are connected to the memory cells, and include a selected word line and a non-selected word line. The plurality of bit lines are connected to the NAND strings, and include a selected bit line and a non-selected bit line. The page buffer/sense circuit pre-charges a readout voltage to the selected bit line, applies a voltage for determining a threshold value of one of the memory cells to the selected word line, applies a voltage capable of turning on the memory cell regardless of a status of the memory cell to the non-selected word line, and detects a voltage of the selected bit line after discharging the selected bit line by electrically coupling the pre-charged selected bit line to the source line. After the selected bit line is pre-charged and when the page buffer/sense circuit is executed, the $\Delta V$ supplying portion applies a positive voltage to the source line, a P-well formed with a selected memory cell selected from the plurality of memory cells and the non-selected bit line adjacent to the selected bit line within a predetermined time period.

Preferably, the page buffer/sense circuit discharges the selected bit line after the $\Delta V$ supplying portion applies the positive voltage, and the $\Delta V$ supplying portion stops applying the positive voltage before the page buffer/sense circuit detects the voltage of the selected bit line. Preferably, the positive voltage is set according to a negative threshold value of the memory cell that is to be read. Preferably, the $\Delta V$ supplying portion shorts out the source line, the P-well and the non-selected bit line, and simultaneously applies the positive voltage to the source line, the P-well and the non-selected bit line. Preferably, the $\Delta V$ supplying portion includes a plurality of transistors respectively connected with the source line, the P-well and the non-selected bit line. Moreover, the $\Delta V$ supplying portion may simultaneously turn on the transistors via a common selection gate line commonly connected with gates of the transistors and apply the positive voltage to the transistors. Preferably, the NAND flash memory of the disclosure further comprises a bit line selecting circuit disposed between the bit lines and the page buffer/sense circuit, wherein the selected bit line is selected and connected to the page buffer/sense circuit by the bit line selecting circuit. When the selected bit line is an odd-numbered bit line, the non-selected bit line is an even-numbered bit line, and when the selected bit line is an even-numbered bit line, the non-selected bit line is an odd-numbered bit line. Preferably, the page buffer/sense circuit is executed during an erasing verification. Preferably, the memory cell is capable of memorizing multi-bit data, and at least a first threshold value of a first data and a second threshold value of a second data in the memory cell are set as negative voltages.

(Benefits of the Disclosure)

According to the disclosure, after pre-charging the selected bit line during the reading process, the positive voltage is applied to the source line, the P-well formed with the selected memory cell and the adjacent non-selected bit line, and thus the reading of the negative threshold voltage of the selected memory cell can be performed without using a negative-voltage-generating circuit or a triple-well structure.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 2A is a cross-sectional diagram of a NMOS transistor of a twin well structure, and FIG. 2B is a cross-sectional diagram of a NMOS transistor of a triple-well structure.

FIG. 6 is a diagram showing an example of voltages that are applied to respective portions when a flash memory is in action according to an embodiment of the disclosure.

DESCRIPTION OF THE EMBODIMENTS

In the following, embodiments of the disclosure will be described in detail with references to the accompanying drawings. In addition, it is to be noted that, various portions are being emphasised for an ease of understanding, and thus are not illustrated in the same ratios with the actual elements.

Figure 1:
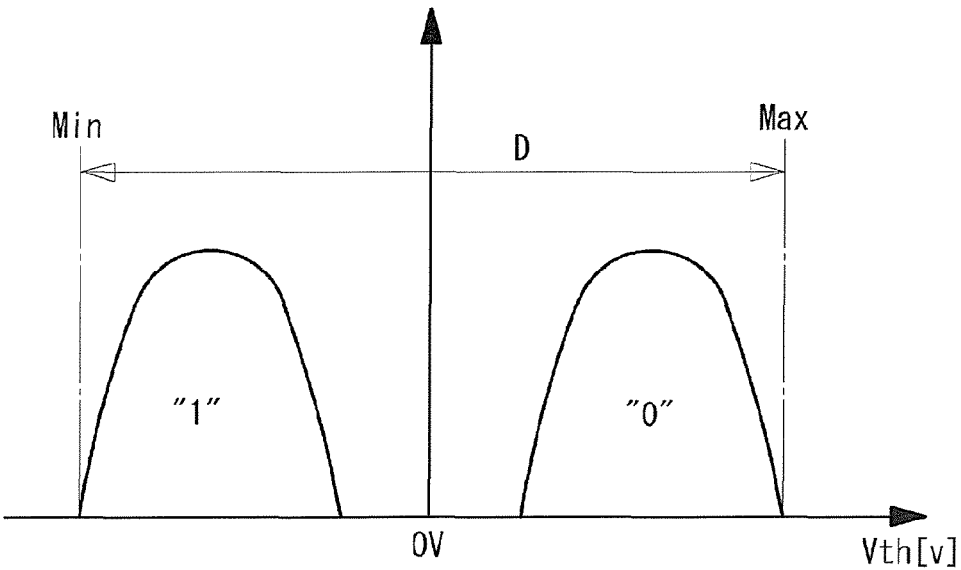
FIG. 1 is a diagram illustrating a threshold value distribution of a NAND flash memory.
Figure 2A:
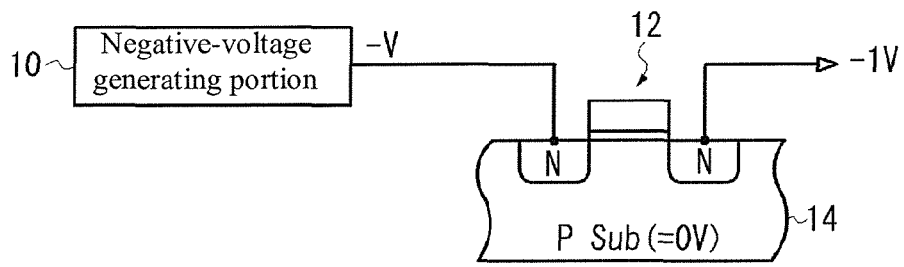
FIG. 2A and FIG. 2B are diagrams for explaining the problem of a negative-voltage-generating circuit.
Figure 2B:
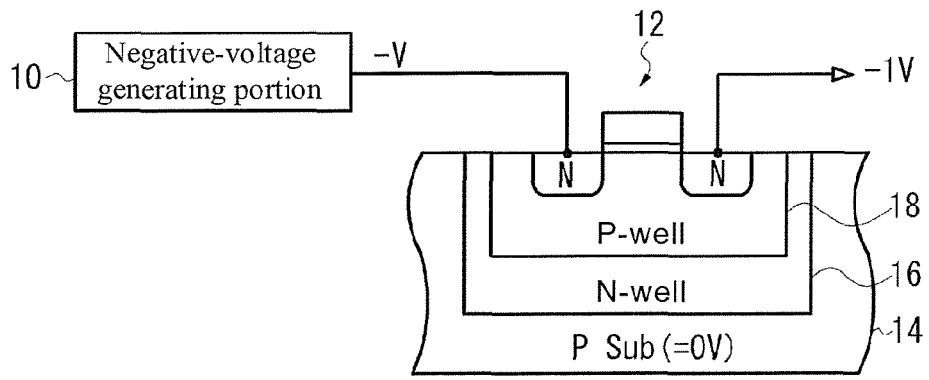
Figure 3:
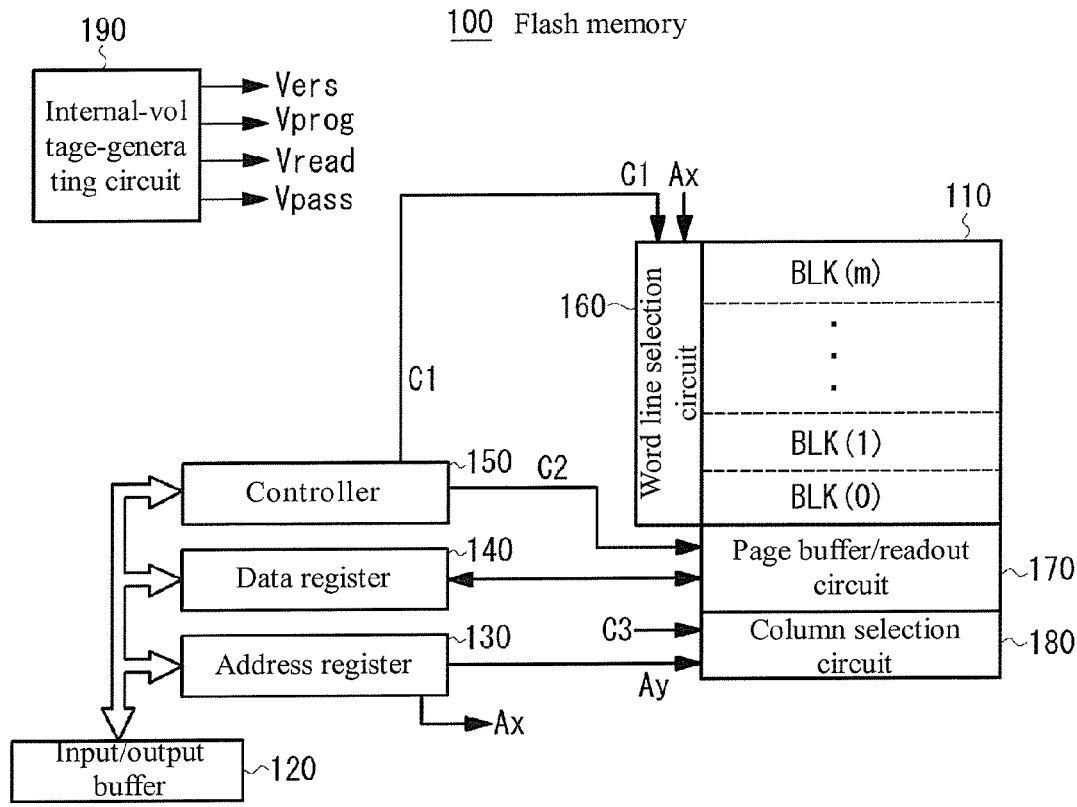
FIG. 3 is a block diagram illustrating a structural example of the NAND flash memory according to an embodiment of the disclosure.

FIG. 3 illustrates the structure of a NAND flash memory 100 according to an embodiment of the disclosure. As shown in the figure, the flash memory 100 of the present embodiment includes a memory array 110, an input/output buffer 120, an address register 130, a data register 140, a controller 150, a word line selection circuit 160, a page buffer/sense circuit 170, a column selection circuit 180, and an internalvoltage-generating circuit 190. The memory array 110 includes a plurality of memory cells arranged into an array. The input/output buffer 120 is connected to an external input/output terminal I/O. The address register 130 receives address data from the input/output buffer 120. The data register 140 stores input/output data. The controller 150 generates control signals C1, C2, C3, C4, etc., wherein the control signals C1, C2, C3, C4, etc. control respective portions based on command data from the input/output buffer 120 and an external control signal (chip-enabled or address-latch-enabled; not shown in the figure). The word line selection circuit 160 decodes a row address information Ax from the address register 130 and performs selections of blocks and word lines based on the decoding result. The page buffer/sense circuit 170 stores data readout from bit lines or uses the bit lines to store program data. The column selection circuit 180 decodes a column address information Ay from the address register 130 and performs a selection of bit lines based on the decoding result. The internal-voltage-generating circuit 190 generates voltages (a programming voltage Vprog, a passing voltage Vpass, a readout voltage Vread, an erasing voltage Vers and so forth) required for reading the data, programming the data, erasing the data and so forth. The structure of the flash memory as shown in FIG. 3 is merely an example, such that the disclosure is not limited to such structure.

The memory array 110 has a plurality of blocks BLK(0), BLK(1), . . . , BLK(m) disposed along a column direction. An end portion of the blocks is disposed with the page buffer/sense circuit 170. However, the page buffer/sense circuit 170 may also be disposed at another end portion of the blocks or disposed at end portions at the two sides.

Figure 4:
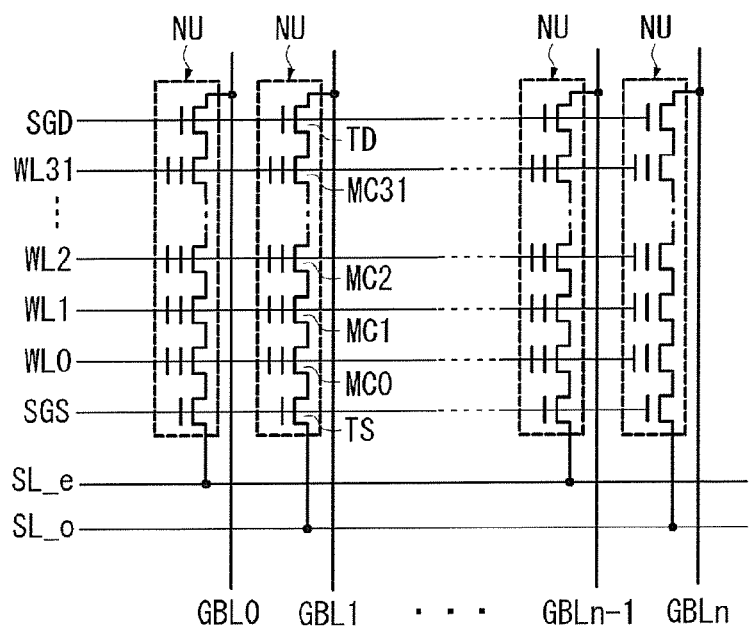
FIG. 4 is a circuit diagram illustrating the structure of NAND strings according to an embodiment of the disclosure.

In one memory block, as shown in FIG. 4, a plurality of NAND string units NU that includes a plurality of memory cells connected together in series is formed, and in one memory block, n+1 string units NU are arranged along the row direction. The string units NU include a plurality of memory cells MCi(i=0, 1, . . . , 31), a bit line side selection transistor TD and a source line side selection transistor TS. The memory cells MCi(i=0, 1, . . . , 31) are connected in series. The bit line side selection transistor TD is connected with one of the end portions, namely, with the drain side of the memory cell MC31. The source line side selection transistor TS is connected with another end portion, namely, the source side of the memory cell MC0. The drain of the bit line side selection transistor TD is connected a corresponding bit line GBL. The source of each even-numbered source line side selection transistor TS is connected to a common even-numbered source line SL_e, and the source of each odd-numbered source line side selection transistor TS is connected to a common odd-numbered source line SL_o.

Control gates of the memory cells MCi are connected to word lines WLi, and the gates of the bit line side selection transistor TD and the source line side selection transistor TS are respectively connected to selection gate lines SGD and SGS that are parallel to the word lines WLi. When the word line selection circuit 160 selects the memory block based on the row address Ax, the selection transistors TD and TS are selectively driven by the selection gate lines SGS and SGD of the memory block.

The memory cell MCi has a metal oxide semiconductor (MOS) structure, and the MOS structure includes a source/drain, a tunnelling oxide film, a floating gate (electrical charge accumulating layer), and a control gate. The source/drain is a N-type diffusion region and is formed within a P-well. The tunnelling oxide film is formed on a channel between the source/drain. The floating gate is formed on the tunnelling oxide film, and the control gate is formed on the floating gate through a dielectric film layer. When the floating gate does not have electrical charges accumulated therein, namely, when the data "1" has been written, the threshold value is in a negative state, and the memory cell is normally on. When the floating gate is accumulated with electrons therein, namely, when the data "0" has been written, a threshold value shift is positive, and the memory cell is normally off.

The bit lines GBL0, GBL1, . . . , GBLn connected to the string units NU are connected to the page buffer/sense circuit 170 through the bit line selecting circuit 200. During reading or programming, the bit line selecting circuit 200 selects the even-numbered bit lines or the odd-numbered bit lines, and connects the selected even-numbered bit lines or the selected odd-numbered bit lines to the page buffer/sense circuit 170.

Figure 5:
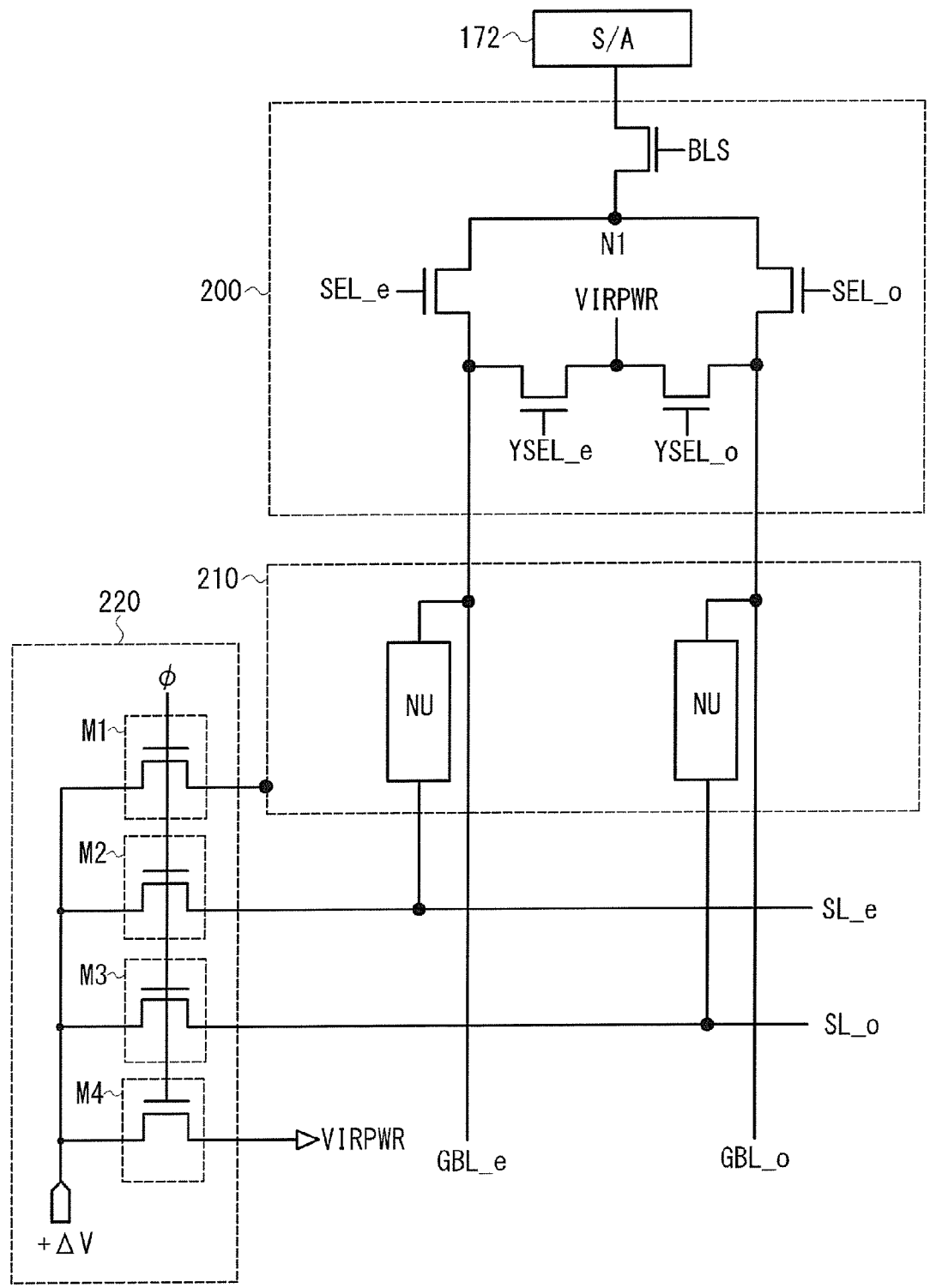
FIG. 5 is a circuit diagram illustrating the structure of a bit line selecting circuit according to an embodiment of the disclosure.

FIG. 5 shows an example of the specific structure of the bit line selecting circuit of the present embodiment. For instance, an even-numbered bit line GBL_e and an odd-numbered bit line GBL_o are illustrated as a pair of bit lines herein. A sense amplifier 172 of the page buffer/sense circuit 170 is shared by the even-numbered bit line GBL_e and the odd-numbered bit line GBL_o in a pair, if the even-numbered bit line and the odd-numbered bit line that are connected to one word line each constitutes 1 page, then the page buffer/sense circuit 170 would include 1 page of sense circuit and page buffer.

The sense amplifier 172 may include a voltage detection sense circuit, and the voltage detection sense circuit compares a baseline potential and a potential of the even-numbered bit line GBL_e or the odd-numbered bit line GBL_o during reading. The sense amplifier 172 is connected with a latch circuit (not shown) thereon, the latch circuit holds the data read by or the data programmed by the sense amplifier 172. The latch circuit is connected to the input/output line through the transmission transistors.

The bit line selecting circuit 200 has an even-numbered selection transistor SEL_e, an odd-numbered selection transistor SEL_o, a bit line selection transistor BLS, an even-numbered bias selection transistor YSEL_e, and an odd-numbered bias selection transistor YSEL_o. The even-numbered selection transistor SEL_e is connected in series with the even-numbered bit line GBL_e, and the odd-numbered selection transistor SEL_o is connected in series with the odd-numbered bit line GBL_o. The bit line selection transistor BLS is connected between a common node Ni of the even-numbered bit line GBL_e and the odd-numbered bit line GBL_o and the sense amplifier 172. The even-numbered bias selection transistors YSEL_e is connected between the even-numbered bit line GBL_e and a virture potential VIRPWR, and the odd-numbered bias selection transistor YSEL_o is connected between the odd-numbered bit line GBL_o and the virture potential VIRPWR.

The even-numbered selection transistor SEL_e, the odd-numbered selection transistor SEL_o, the even-numbered bias selection transistor YSEL_e, the odd-numbered bias selection transistor YSEL_o, and the bit line selection transistor BLS are N-type MOS transistors. Control signals from the controller 150 are respectively applied to the gates of the selection transistors, and the selection transistors are selectively being driven during reading, programming, or erasing according to the applied control signals. Moreover, under the control of the controller 150, the internal-voltage-generating circuit 190 supplies various bias voltages corresponding to the action statuses to the virtual potential VIRPWR.

In the flash memory, reading or programming is performed in a unit of page, and erasing is performed in a unit of block. For instance, during a page reading, when the even-numbered bit line GBL_e is selected, the odd-numbered bit line GBL_o is not selected, and thus the even-numbered selection transistor SEL_e and the bit line selection transistor BLS are turned on, the odd-numbered selection transistor SEL_o is turned off, and the even-numbered bit line GBL_e is electrically coupled to the sense amplifier 172. Moreover, the even-numbered bias selection transistor YSEL_e is turned off, the odd-numbered bias selection transistor YSEL_o is turned on, and the odd-numbered bit line GBL_o is coupled to the voltage supplied from the virtual potential VIRPWR.

On the other hand, when the odd-numbered bit line GBL_o is selected, the even-numbered bit line GBL_e is not selected, and thus the odd-numbered selection transistor SEL_o and the bit line selection transistor BLS are turned on, the even-numbered selection transistor SEL_e is turned off, and the odd-numbered bit line GBL_o is electrically coupled to the sense amplifier 172. Moreover, the even-numbered bias selection transistor YSEL_e is turned on, the odd-numbered bias selection transistor YSEL_o is turned off, and the even-numbered bit line GBL_e is coupled to the voltage supplied from the virtual potential VIRPWR.

As described above, the NAND string units NU are formed within the P-well 210. One P-well 210 constitutes one block. The source line side selection transistors TS of the even-numbered string units NU are connected to the common even-numbered source line SL_e, and the source line side selection transistors TS of the odd-numbered string units NU are connected to the common odd-numbered source line SL_o.

The present embodiment further has a $\Delta V$ supplying portion 220, and the $\Delta V$ supplying portion 220 supplies positive voltage of $+\Delta V$ to the P-well 210, the even-numbered source line SL_e/odd-numbered source line SL_o and the non-selected bit lines. The constitution of the $\Delta V$ supplying portion 220 is to: short out and supply a positive bias voltage to the even-numbered source line SL_e/odd-numbered source line SL_o and the non-selected bit lines. For instance, the $\Delta V$ supplying portion 220 includes a transistor M1 coupled to the P-well 210, a transistor M2 coupled to the even-numbered source line SL_e, a transistor M3 coupled to the odd-numbered source line SL_o, and a transistor M4 coupled to the virtual potential VIRPWR. A common selection gate line $\phi$ is connected to each gate of the transistors M1 to M4, so as to supply $+\Delta V$ to the drains of the transistors M1 to M4. In this exemplary embodiment, the P-well 210, the source lines SL_e and SL_o, and the non-selected bit line can be connected in parallel by the transistors M1 to M4 that are turned on, as illustrated in FIG. 5. The $\Delta V$ supplying portion 220, as described in below, (simultaneously or selectively) turns on the transistors M1 to M4 (via a selection signal) through the selection gate line $\phi$, within a predetermined time period, when the reading of a negative threshold value of a selected memory cell is being performed, and supplies $\Delta V$ to P-well 210, the even-numbered source line SL_e/odd-numbered source line SL_o and the virtual potential VIRPWR.

FIG. 6 is an exemplary table showing the bias voltages being applied during the various processes of the flash memory. During the reading process, a positive voltages is applied to the bit line, a voltage (e.g., 0 V) is applied to the selected word line, and a passing voltage Vpass (e.g., 4.5 V) is applied to the non-selected word line. Positive voltages (e.g., 4.5 V) are applied to the selection gate lines SGD and SGS, so as to turn on the bit line side selection transistor TD and the source line side selection transistor TS. During programming (writing) process, a programming voltage Vprog of high voltage (e.g., 15 V to 20 V) is applied to the selected word line, and an intermediate potential (e.g., 10 V) is applied to the non-selected word line, the bit line side selection transistor TD is turned on, and the source line side selection transistor TS is turned off, so as to supply a potential corresponding to the data of "0" or "1" to the bit line GBL. During erasing process, 0 V is applied to the selected word line in the block, a high voltage (e.g., 20 V) is applied to the P-well, and the electrons of the floating gate are extracted to the substrate, so as to erase data in units of block.

Next, detailed reading process of the flash memory of the present embodiment will be explained. The controller 150 executes the reading process when receives a readout command or perform is an erasing verification. In the present embodiment, a reading for verifying the negative threshold value of the memory cell, such as verifying whether the lower limit value Min of the negative threshold value distribution of the data "1" has been exceed, will be explained. The page reading process is performed by means of reading the even-numbered bit line or the odd-numbered bit line, alternatively.

Figure 7:
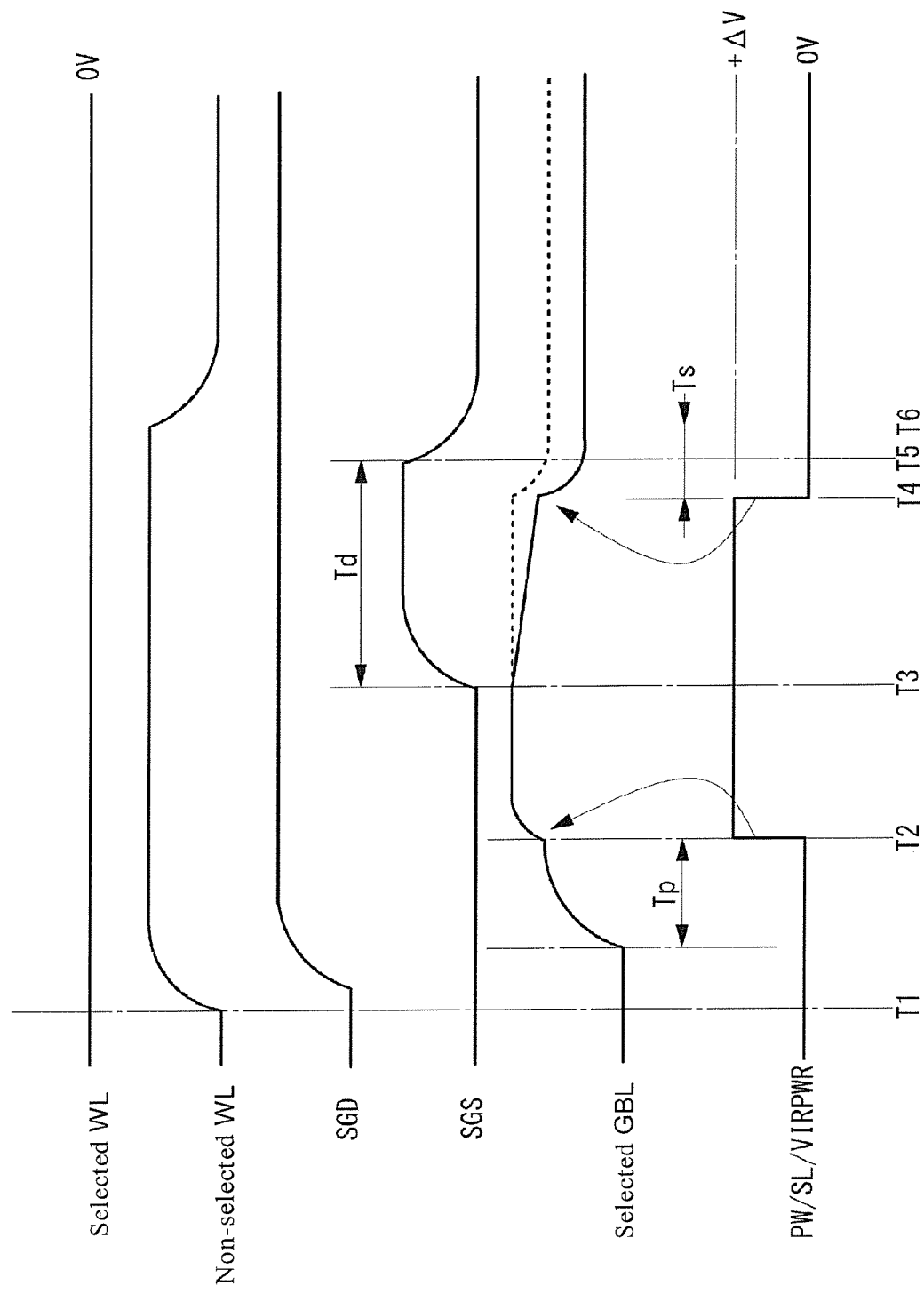
FIG. 7 is a diagram illustrating waveforms of the respective portions of a flash memory during a reading process according to an embodiment of the disclosure.

FIG. 7 illustrates waveforms of the respective portions of the flash memory of the present embodiment during the reading process. Times T1-T2 are a pre-charging period of the selected bit line. Herein, assuming that the selected bit line is the even-numbered bit line GBL_e, then the odd-numbered bit line GBL_o is the non-selected bit line. Within the pre-charging period, the bit line selection transistor BLS of the bit line selecting circuit 200 is turned on, the even-numbered selection transistor SEL_e is turned on, the odd-numbered selection transistor SEL_o is turned off, the even-numbered bias selection transistor YSEL_e is turned off, and the odd-numbered bias selection transistor YSEL_o is turned on. Moreover, the selection gate line SGD is, for example, applied with 4.5 V, the bit line side selection transistor TD is turned on, the selection gate line SGS is still maintained with 0 V, and the source line side selection transistor TS is turned off. The sense amplifier 172 supplies a fixed pre-charging voltage to pre-charge the even-numbered bit line GBL_e through the bit line selection transistor BLS. Specifically, during a period Tp, electrical charges are pre-charged to the even-numbered bit line GBL_e. On the other hand, the virtual potential VIRPWR is being supplied with 0 V, and the odd-numbered bit line GBL_o is coupled to the ground level.

At time T2, the bit line selection transistor BLS is turned off, and the pre-charging of the even-numbered bit line GBL_e is ended. And, at time T2, the $\Delta V$ supplying portion 220 turns on the transistors M1 to M4 through the selection gate line $\phi$, and supply $+\Delta V$ to the P-well 210, the even-numbered source line SL_e/odd-numbered source line SL_o and the non-selected bit line (namely, the odd-numbered bit line GBL_o). The voltage of $\Delta V$ is set according to the negative threshold value of the memory cell that is to be read. When the P-well 210 and the even-numbered source line SL_e are applied with $\Delta V$, both a n-type source of the source line side selection transistor TS and the P-well 210 have the same potential, and no forward bias is formed therein. When the P-well 210 is applied with $\Delta V$, the potential of the even-numbered bit line GBL_e is raised due to a capacitive coupling with the P-well, and is also raised due to a capacitive coupling with the adjacent odd-numbered bit line GBL_o, which is applied with $\Delta V$. As a result, the voltage of the even-numbered bit line GBL_e is raised to about the pre-charged voltage of $+\Delta V$. Following the voltage rise of the even-numbered bit line GBL_e, the voltage of the selection gate line SGD is also raised up to 4.5 V+ΔV.

Next, at time T3, the selection gate line SGS of the source line side selection transistor TS is, for example, being applied with 4.5 V+ΔV, and the source line side selection transistor TS is turned on. Now, the bias voltages of various portions of the selected memory cell are as follows. The drain voltage=the pre-charged voltage+ΔV, the source=ΔV, the back gate (P-well)=ΔV, and the control gate=0 V. The bias voltages are substantially the same as the following applied voltages; namely, the drain=the pre-charged voltage, the source=0 V, the back gate (P-well)=0 V, and the control gate=−ΔV. In other words, if the negative threshold value of the selected memory cell is smaller than −ΔV, then the selected memory cell is turned on, and if the negative threshold value is greater than −ΔV, then the selected memory cell is turned off, so that the state of the negative threshold value of the selected memory cell can be read with −ΔV.

If the selected memory cell is turned on, then the potential of the even-numbered bit line GBL_e would be discharged to the even-numbered source line SL_e; and if the selected memory cell is not turned on, then the potential of the even-numbered bit lines GBL_e would not be discharged but would be maintained. At time T4, a potential difference between the even-numbered bit lines GBL_e, which discharges to the even-numbered source line SL_e (shown by a solid line), and the even-numbered bit lines GBL_e, which is not discharged (shown by a dotted line), is adequately expanded. At this time T4, the supply of ΔV from the ΔV supplying portion 220 is stopped, and the transistors M1 to M4 are turned off. As a result, the P-well 210, the even-numbered source line SL_e/odd-numbered source line SL_o, and the virtual potential VIRPWR are coupled to 0 V through a circuit (not shown). At time T5 that comes right after the time T4, the source line side selection transistor TS is turned off, and the discharging of the even-numbered bit line GBL_e ends. Times T4-T6 define a readable period Ts of the sense amplifier 172, and times T3-T5 define a dischargeable period Td of the selected bit line. The supply of ΔV from the ΔV supplying portion 220 is returned back to 0 V at least before the reading (sensing) of the sense amplifier 172 begins. Hence, the reading of the negative threshold voltage of the memory cell of the even-numbered bit line can be performed. When the reading of the even-numbered bit line ends, the reading of the odd-numbered bit line is subsequently performed using the same method.

As such, based on the present embodiment, the reading of the negative threshold voltage of the memory cell can be performed without using a negative-voltage-generating circuit, and also without forming a triple-well structure. Hence, an area dedicated to the negative-voltage-generating circuit or the triple-well structure can be reduced, thereby realizing the miniaturization and the high integration of wafer size. Moreover, as described below, through applying the reading method of the present embodiment to an erasing verification during the erasing process, the lower limit value Min of the threshold value distribution of the data "1" can be controlled not exceeding a fixed value.

In addition, the amount of ΔV of the ΔV supplying portion 220 may be appropriately selected according to the negative threshold value of the memory cell that is to be verified. For instance, the ΔV of the ΔV supplying portion 220 may be the ΔV generated by the internal-voltage-generating circuit 190.

Moreover, in the said embodiment, a structure in which the source lines are separated into the even-numbered source line SL_e and the odd-numbered source line SL_o has been adopted, but not limited thereto, such that a structure in which the source lines are connected with the even-numbered bit line GBL_e and the odd-numbered bit line GBL_o may also be adopted.

Figure 8A:
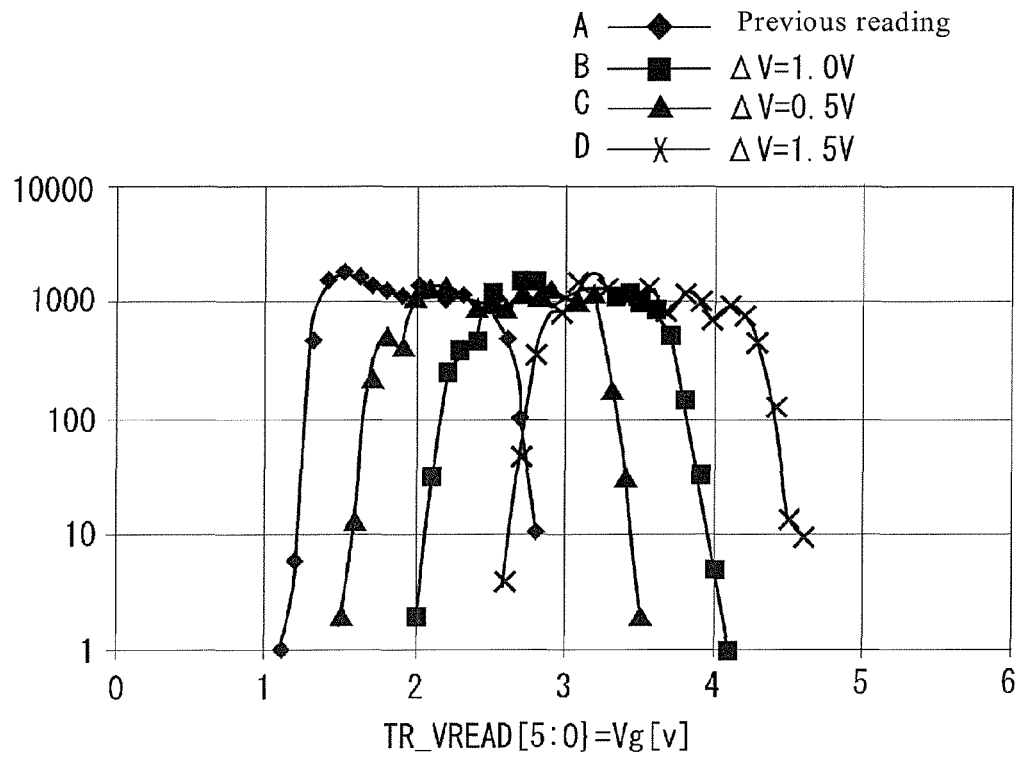
FIG. 8A, FIG. 8B and FIG. 8C are curve diagrams illustrating relationships between gate voltages and distribution values of memory cells when voltages of $\Delta V$ are being applied according to an embodiment of the disclosure.
Figure 8B:
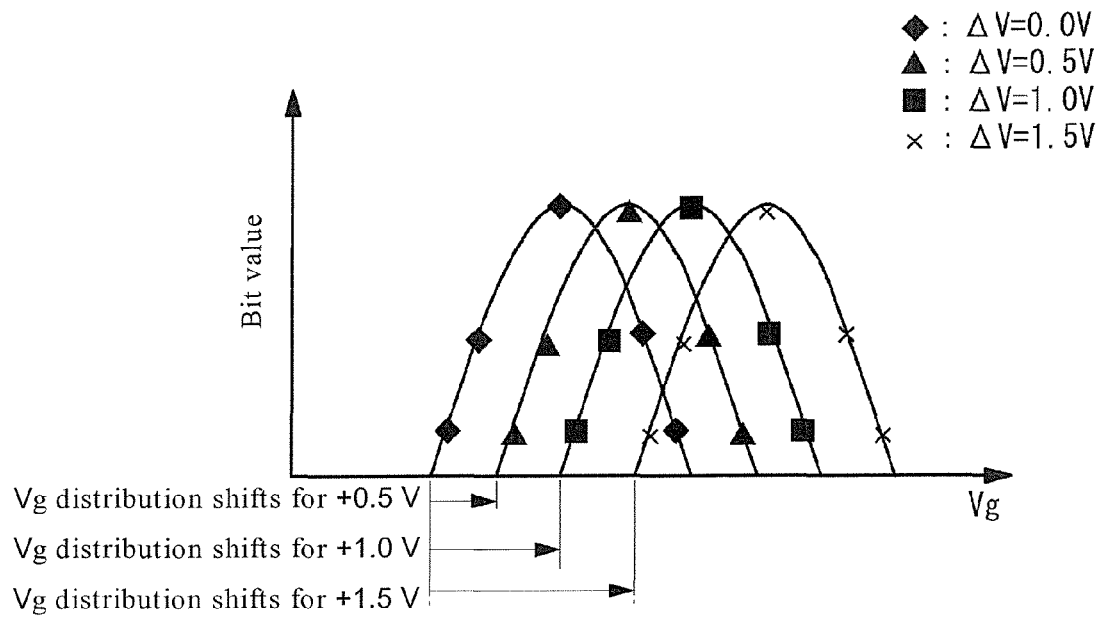
Figure 8C:
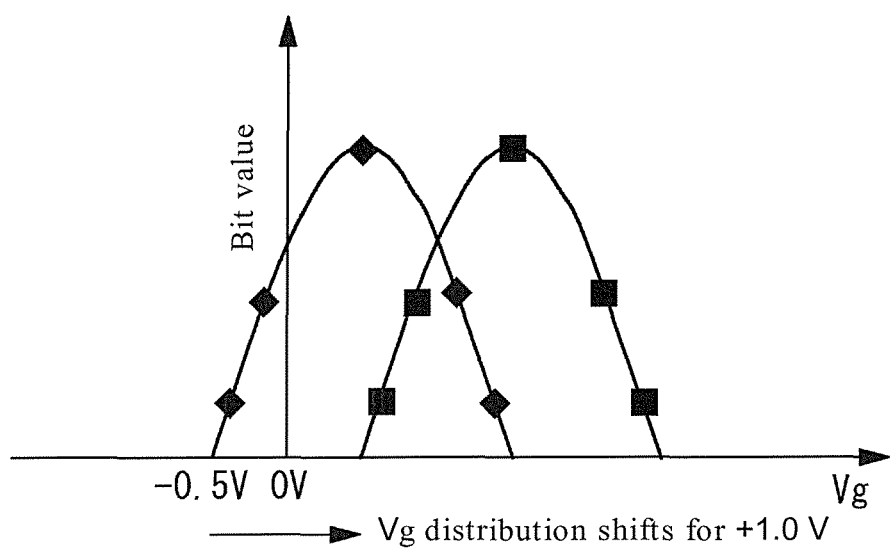

FIG. 8A, FIG. 8B and FIG. 8C are curve diagrams illustrating threshold value distributions of the memory cells when the bias voltages are being applied according to the present embodiment. Curve A (represented with ♦) is the threshold value distribution during a traditional page reading (1 page=2 KB); herein, the voltage of ΔV (namely, ΔV=0 V) is not supplied. Curve B (represented with ■), curve C (represented with ▲) and curve D (represented with ×), as in the present embodiment, represent the measurement results of the threshold value distributions of the P-well, the source line SL and the non-selected bit line when ΔV=1.0 V, 0.5 V and 1.5 V are respectively applied thereto. For instance, when ΔV=0.5 V is applied, threshold value distribution shifts for 0.5 V compared with the threshold value distribution of a traditional page reading. This indicates that, depending on the voltage of ΔV, the gate voltage of the memory cell can only be varied within ΔV. FIG. 8B represents the distributions of the gate voltage Vg and the threshold value Vth when ΔV=0.0 V, 0.5 V, 1.0 V and 1.5 V, such that the distribution of the gate voltage Vg/threshold value can be shifted depending on the voltage of ΔV. FIG. 8C compares the traditional reading and an example of the reading of the present embodiment. As shown, when it is desired to readout a lower limit value of the threshold value distribution of the negative threshold value that is down to −0.5 V, if ΔV=above 0.5 V (e.g., ΔV=+1.0 V), then a Vg distribution started from Vg=0.5 V can be obtained, and if the lower limit value is Vg=0.5 V, as being converted into the threshold value Vth, then the threshold value Vth is −0.5 V.

Figure 9:
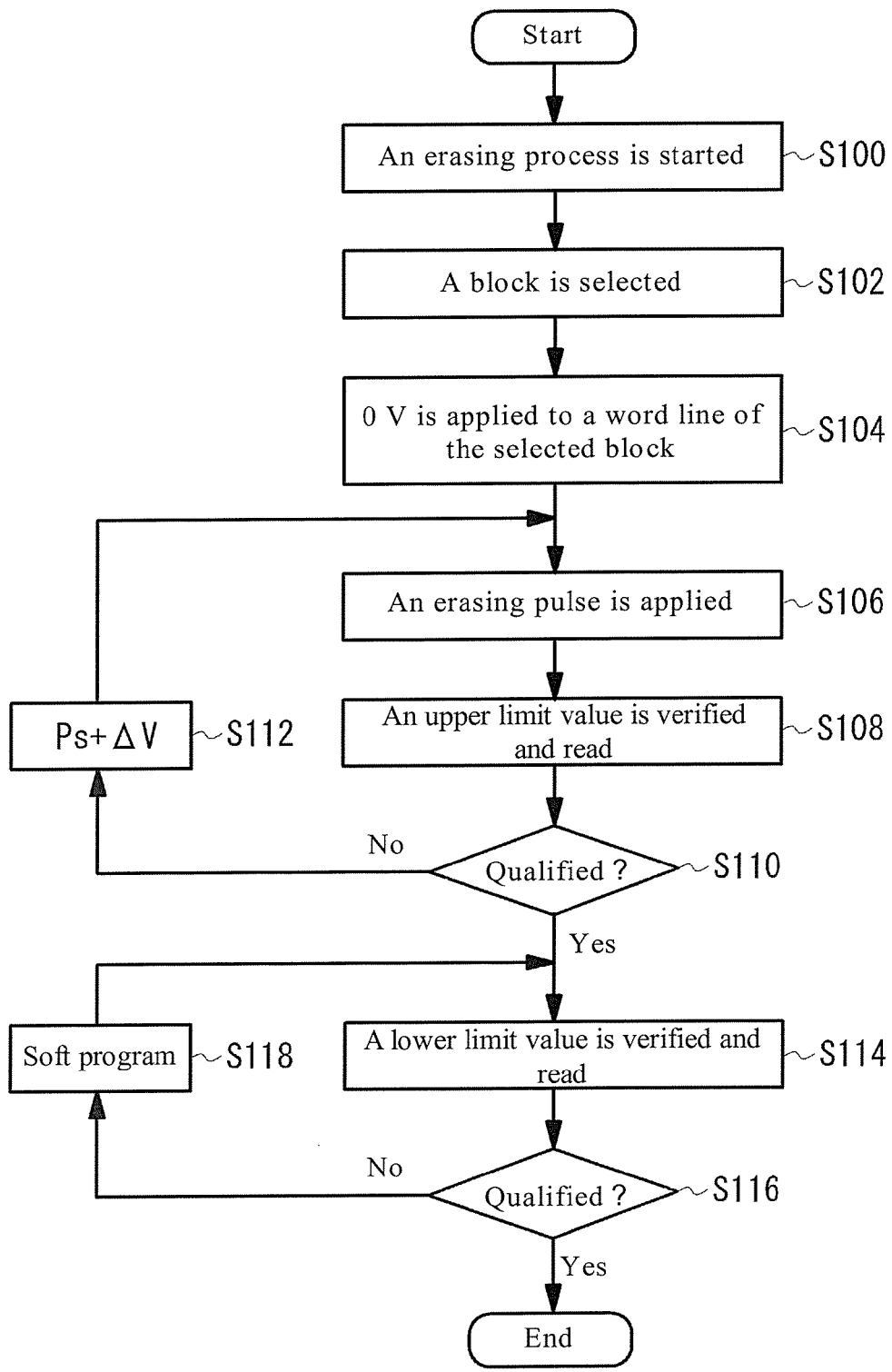
FIG. 9 is a flow chart illustrating an erasing process of a flash memory according to an embodiment of the disclosure.

Next, another preferred example in the embodiment of the disclosure will be described. The reading method of the present embodiment is implemented in the erasing verification of the flash memory. FIG. 9 shows the flow of the erasing process of the flash memory of the present embodiment. The controller 150 starts the erasing process when an erasing command is received (S100). The word line selection circuit 160 selects the block to be erased (S102), then applies 0 V to the word line of the selected block (S104), and applies an erasing pulse Ps generated by the internal-voltage-generating circuit 190 to the P-well 210 (S106). The step of applying the erasing pulse Ps is, for example, executed through an erasing pulse applying circuit (omitted in the drawing) controlled by the controller 150. After the erasing pulse Ps is applied, an erasing verification is performed for verifying whether a threshold value of the erasing cell is lower than a predetermined value (S108). The erasing verification is performed under a bias condition of the general reading process, and verifies whether the upper limit value of the threshold value of the data "1" is lower than 0 V. If the threshold value of the erasing cell is lower than the predetermined value, then it is determined as qualified (S110), and thereby the applying of the erasing pulse is ended. On the other hand, if the threshold value of the erasing cell is above the predetermined value, then it is determined as unqualified (S110). When it is determined as unqualified, an erasing pulse Ps that adds ΔV to the voltage of the previous erasing pulse Ps is generated, and this erasing pulse Ps is applied to the selected block (S112).

In the step S110, if the upper limit value of the data "1" is determined to be qualified, then the verification of the lower limit value of the threshold value distribution of the data "1" would be performed (S114). In the verification of the lower limit value, the P-well, the source line SL and the non-selected bit line are supplied with +ΔV, such as supplying the gate with a negative voltage of −ΔV, so as to perform the reading of the negative threshold value of the memory cell. If the threshold value of the erasing cell is above the lower limit value added by a determined value, then it is determined as unqualified (S116), and a soft programming is performed on the erasing cell that is determined as unqualified (S118). By applying a fixed positive pulse (+ΔV) to a control gate of the erasing cell, the threshold value of the erasing cell shifts slightly towards a positive direction. Through implementing the verification of the lower limit value of the erasing cell, a negative threshold value distribution margin of the data "1" can be narrowed.

Figure 10A:
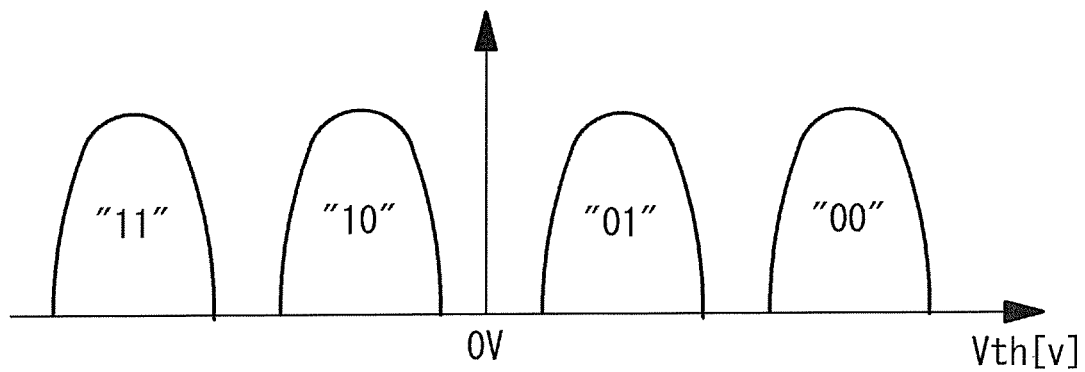
FIG. 10A and FIG. 10B are diagrams illustrating a configuration example of threshold values of a multi-value flash memory according to an embodiment of the disclosure.
Figure 10B:
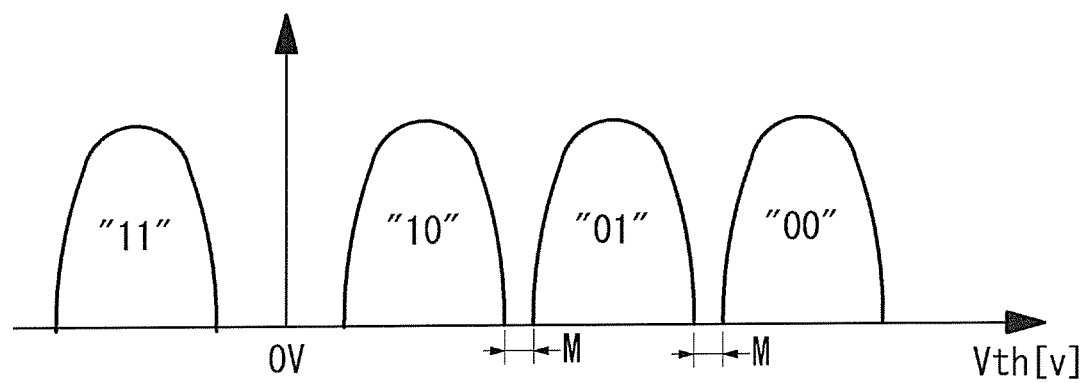

Next, situations regarding the flash memory of the present embodiment that is adapted to use memory cells in memorizing of multi-value data will be described. The reading method of the present embodiment can readout the negative threshold values of the memory cells, and thus can set the threshold value distributions of multi-bit data, as shown in FIG. 10A. That is, a threshold value of a data "11" and a threshold value of a data "10" can respectively be set to negative values, and a threshold value of the data "01" and a threshold value of a data "00" can respectively be set to positive values. When it is unable to perform the reading of the negative threshold values of the memory cells, the threshold values of the data "10", "01" and "00" must be set to positive values, as shown in FIG. 10B, such that limits M between the threshold value distribution margins are narrowed, a programming sequence used for setting the limits becomes complicated, and, at the same time, the reliability of the data is also reduced. On the other hand, if an upper limit value of the data "00" is increased, then a voltage applied to the gate of the memory cell during the verification would be increased, and, sometimes, channel hot electrons would be injected into the floating gate of the memory cell and thereby alters the threshold value. Hence, an upper limit of the threshold value of the data "00" is being restricted. As in the present embodiment, by setting the threshold values of the data "11" and "10" to negative values, the limits M of the threshold value distribution margins of the data "01" and "00" can be enlarged, thereby enhancing the reliability of the data.

In view of the foregoing, preferred embodiments of the present disclosure have been described in detail, but the disclosure is not limited to specific embodiments. Various modifications and variations can be made to the structure of the present disclosure without departing from the scope or spirit of the disclosure.

What is claimed is:

1. A reading method of a NAND flash memory comprising:
   applying a pre-charge voltage to a selected bit line;
   applying a voltage for determining a threshold value of a memory cell to a selected word line;
   applying a voltage capable of turning on the memory cell regardless of a status of the memory cell to a non-selected word line;
   detecting a voltage of the selected bit line after discharging the selected bit line by electrical coupling the pre-charged selected bit line to a source line; and
   after pre-charging the selected bit line, applying a same positive voltage to the source line, a P-well formed with a selected memory cell and a non-selected bit line adjacent to the selected bit lines within a predetermined time period.

2. The reading method of the NAND flash memory as recited in claim 1, further comprising:
   discharging the selected bit line started after applying the positive voltage, and wherein the step of applying the positive voltage is stopped before detecting the voltage of the selected bit line.

3. The reading method of the NAND flash memory as recited in claim 1, wherein the positive voltage is set according to a negative threshold value of the memory cell that is to be read.

4. The reading method of the NAND flash memory as recited in claim 1, wherein the step of applying the positive voltage comprises:
   shorting out the source line, the P-well and the non-selected bit line; and
   simultaneously applying the positive voltage to the source line, the P-well and the non-selected bit line.

5. The reading method of the NAND flash memory as recited in claim 1, wherein the step of applying the positive voltage comprises:
   turning on a plurality of transistors respectively connected with the source line, the P-well and the non-selected bit line, such that the source line, the P-well and the non-selected bit line are connected in parallel; and
   applying the positive voltage to the transistors.

6. The reading method of the NAND flash memory as recited in claim 1, wherein when the selected bit line is an odd-numbered bit line, the non-selected bit line is an even-numbered bit line, and when the selected bit line is an even-numbered bit line, the non-selected bit line is an odd-numbered bit line.

7. The reading method of the NAND flash memory as recited in claim 1, wherein the reading method of the NAND flash memory is executed for verifying a lower limit value of a negative threshold value distribution at erasing.

8. The reading method of the NAND flash memory as recited in claim 7, wherein the reading method of the NAND flash memory is executed after verifying an upper limit value of the negative threshold value distribution at erasing.

9. The reading method of the NAND flash memory as recited in claim 8, wherein if the upper limit value of the threshold value of the data "1" of the erasing cell is above the predetermined value, then it is determined as unqualified, and then an erasing pulse that adds ΔV to the voltage of the previous erasing pulse is generated and applied to a selected block including the selected memory cell.

* * * * *